(12) United States Patent
Yamada

(10) Patent No.: US 11,937,380 B2
(45) Date of Patent: Mar. 19, 2024

(54) ELECTROMAGNETIC BAND GAP ELEMENT STRUCTURE AND FABRICATION METHODS

(71) Applicant: Nano Dimension Technologies LTD., Nes Ziona (IL)

(72) Inventor: Minoru Yamada, Kowloon (HK)

(73) Assignee: Nano Dimension Technologies, LTD., Nes Ziona (IL)

( * ) Notice: Subject to any disclaimer, the term of this patent is extended or adjusted under 35 U.S.C. 154(b) by 0 days.

(21) Appl. No.: 18/270,550

(22) PCT Filed: Dec. 31, 2021

(86) PCT No.: PCT/US2021/065824
§ 371 (c)(1),
(2) Date: Jun. 30, 2023

(87) PCT Pub. No.: WO2022/147351
PCT Pub. Date: Jul. 7, 2022

(65) Prior Publication Data
US 2023/0397340 A1   Dec. 7, 2023

Related U.S. Application Data

(60) Provisional application No. 63/132,768, filed on Dec. 31, 2020.

(51) Int. Cl.
*H05K 3/12*     (2006.01)
*B22F 10/10*    (2021.01)
(Continued)

(52) U.S. Cl.
CPC ............. *H05K 3/125* (2013.01); *B22F 10/10* (2021.01); *B22F 12/55* (2021.01); *B29C 64/112* (2017.08);
(Continued)

(58) Field of Classification Search
CPC .... H05K 3/125; H05K 3/4664; H05K 1/0236; H01Q 15/008; B29C 64/112; B29C 64/386; B29C 64/336
See application file for complete search history.

(56) References Cited

U.S. PATENT DOCUMENTS 7,288,469 B2 * 10/2007 Sharma .................. H05K 3/125
                                                    438/584
9,929,455 B2 *  3/2018 Tanaka .................. H01P 1/2005
(Continued)

FOREIGN PATENT DOCUMENTS

KR      20150132742 A1    11/2015

OTHER PUBLICATIONS

Atsushi Sanada, Christoph Caloz, Tatsuo Itoh, "Planar Distributed Structures with Negative Reflective Index", IEEE Transactions on Microwave Theory and Techniques, vol. 52, No. 4, pp. 1252-1263, (Apr. 13, 2004).

*Primary Examiner* — Michael P Wieczorek
(74) *Attorney, Agent, or Firm* — Guy Levi; The IP Law Firm of Guy Levi, LLC

(57) ABSTRACT

The disclosure relates to structures of, and methods for forming electromagnetic band gap (EBG) element. Specifically, the disclosure is directed to methods for additively manufacturing electronic mushroom-type EBG elements having a periodic cell structure enabling a reduced footprint and increased band gap range for a very wide range of frequencies, for example between 500 MHz to about 30 GHz, by altering both the EBG structure's superstrate as well as the ground plane.

23 Claims, 2 Drawing Sheets

(51) Int. Cl.
  *B22F 12/55*    (2021.01)
  *B29C 64/112*   (2017.01)
  *B29C 64/336*   (2017.01)
  *B29C 64/386*   (2017.01)
  *B33Y 10/00*    (2015.01)
  *B33Y 50/00*    (2015.01)
  *B33Y 80/00*    (2015.01)
  *H01Q 15/00*    (2006.01)
  *H05K 1/02*     (2006.01)
  *H05K 3/46*     (2006.01)

(52) U.S. Cl.
  CPC .......... *B29C 64/336* (2017.08); *B29C 64/386* (2017.08); *H01Q 15/008* (2013.01); *H05K 1/0236* (2013.01); *H05K 3/4664* (2013.01); *B33Y 10/00* (2014.12); *B33Y 50/00* (2014.12); *B33Y 80/00* (2014.12)

(56) References Cited

U.S. PATENT DOCUMENTS

2008/0264685 A1  10/2008  Park et al.
2010/0108373 A1   5/2010  Park
2019/0373738 A1  12/2019  Kozlovski

* cited by examiner

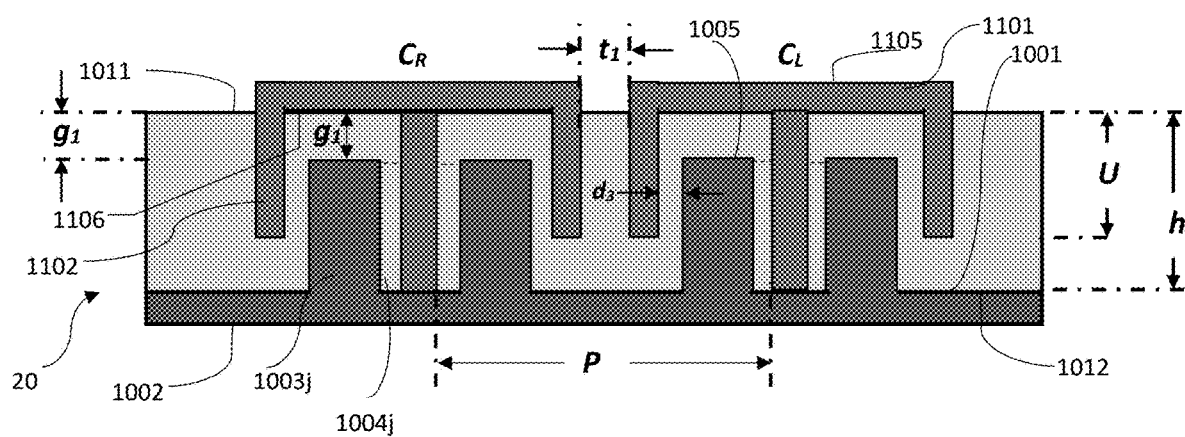
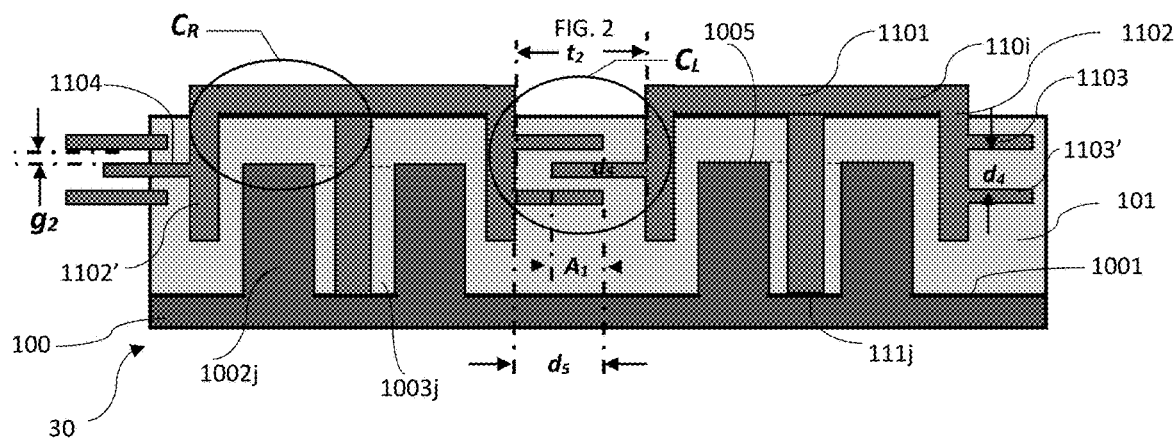
FIG. 3
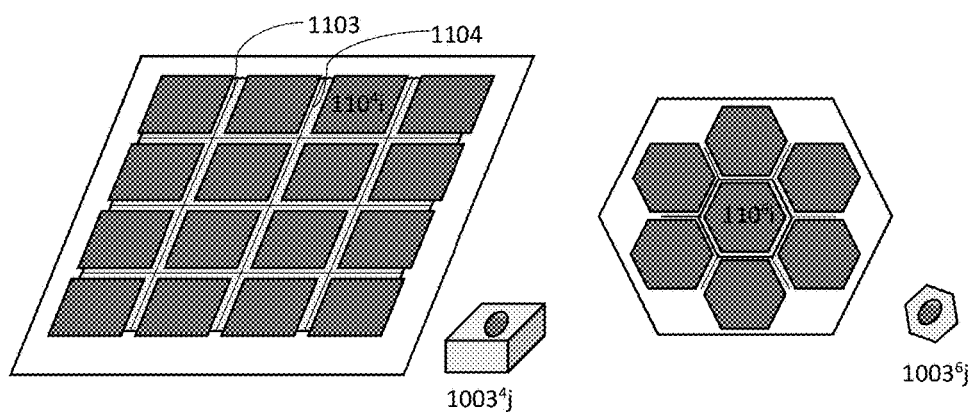
FIG. 4A    FIG. 4B

ELECTROMAGNETIC BAND GAP ELEMENT STRUCTURE AND FABRICATION METHODS

CROSS REFERENCE TO RELATED APPLICATIONS

This patent application is a U.S. National Phase filing of commonly owned PCT Application No. PCT/US21/065824, filed Dec. 31, 2021, which is based on and claims the benefit of the filing date of now expired U.S. Provisional Patent Application Ser. No. 63/132,768, filed Dec. 31, 2020, both which are incorporated herein by reference in their entirely.

BACKGROUND

The disclosure is directed to structure of and methods for forming electromagnetic band gap (EBG) element. Specifically, the disclosure is directed to methods for direct and/or indirect inkjet printing of EBG elements having a structure of periodic mushroom-type cells enabling a reduced footprint for a very wide range of frequencies, for example between 500 MHz to about 30 GHz.

Electronic devices with small form factor are increasingly in demand in all areas where weight, size, cost and footprint impose stringent design constraints. These include, for example: manufacture, business, consumer goods, military, aeronautics, internet of things, and others. Products having these smaller form factors rely on compact electronic circuits with tightly spaced digital and analog circuits placed in close proximity. In many of these applications, the ability of antennas to tune resonances is a base requirement for proper functionality. Furthermore, variability in wireless standards, and emerging 5$^{th}$ Generation (5G) and millimeter wave technologies demand antennae with precise band gap at high frequencies and all within a very small package.

With smaller and smaller transmission and reception modules for use in various application (such as GPS transceivers in smartphones), typically, a plurality of antennas can be disposed on a single dielectric substrate, which can cause a potential signal leak due to mutual coupling between antennas. Surface waves represent an unwanted feature in many antennae, since they propagate along the ground plane instead of radiating in the free space, adversely affecting the efficiency and gain of the antenna, as well as degrading its radiation patterns. Likewise, surface waves cause mutual coupling in antenna arrays, potentially resulting in blind scanning angles in phased array systems. Due to the demand of high speed data transmission, such as, for example, UWB band pass filters, which are very popular nowadays. Surface waves degrade the performance of UWB filters by causing spurious stop bands to appear. Additionally, excitation of resonance modes by simultaneous switching noise (SSN) in multilayer PCBs lead to signal integrity problems and electromagnetic interference (EMI).

To eliminate that leak, an electromagnetic band-gap can be disposed between the two antennas. The creation of the band gap caused by the EBG element acts to essentially eliminate coupling.

The following disclosure addresses the issues described.

SUMMARY

Disclosed, in various exemplary implementations, are structures of and methods for forming electromagnetic band gap (EBG) elements. Further, disclosed herein are methods for direct and/or indirect inkjet printing of EBG elements having a structure of periodic mushroom-type cells enabling a reduced footprint for a very wide range of frequencies, for example between 500 MHz to about 30 GHz.

Typically, EBG elements are built using different kind of technologies such as traditional plain PCB fabrication technologies, where the size of the EBG element is quite big when try to match with band between about 500 KHz and about 30 GHz, such as for example, bandwidth used in Blue-tooth, Zigbby, Wi-Fi, cellular band, mmWave, and RF. The disclosure provides a 3D Structure EBG where the CL and CR value are operating at a much higher values than plain type EBG, thereby enabling very small (mmWave) antennae and integration of the RF circuit to reduce the size of the final product.

In an exemplary implementation provided herein is a computerized method of fabricating an electromagnetic band gap (EBG) element comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") having a central processing module (CPM), in communication with conveyor, and each of the first, and second print heads, the CPM further comprising: at least one processor in communication with a non-transitory computer readable storage medium storing thereon instructions that, when executed by the at least one processor cause the CPM to control the ink-jet printing system, by carrying out steps that comprise: receiving a 3D visualization file representing the EBG element; and generating a file library having a plurality of files, each file representing a substantially 2D layer for printing the EBG element, and a metafile representing at least the printing order of each of the substantially 2D layers for printing; receiving the 3D visualization file representing the EBG element; generating the library of files representing the substantially 2D layer for printing; providing the dielectric ink composition, and the conductive ink composition; obtaining from the library a first file representing the first printing layer of the EBG element, the first file comprising printing instructions for a pattern representative of at least one of: the dielectric ink, and the conductive ink; using the first print head, forming the pattern corresponding to the dielectric ink in the first layer; curing the pattern corresponding to the dielectric ink in the first layer; using the second print head, forming the pattern corresponding to the conductive ink in the first layer; sintering the pattern corresponding to the conductive ink in the first layer; obtaining from the library a subsequent file representative of a subsequent layer for printing the EBG element; the subsequent file comprising printing instructions for a pattern representative of at least one of: the dielectric ink, and the conductive ink in the subsequent layer; repeating the steps of: using the first print head, forming the pattern corresponding to the dielectric ink in the subsequent layer, to the step of sintering the pattern corresponding to the conductive ink in the subsequent layer, wherein upon curing and/or sintering the final layer, the EBG element comprises: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises a facet wall extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore; and removing the substrate.

In another embodiment, provided herein is an electromagnetic band gap (EBG) element comprising: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises a facet wall extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore.

In yet another exemplary implementation, provided herein is an article of manufacture comprising a non-transitory memory storage device storing thereon a computer readable medium (CRM) for fabricating an electromagnetic band gap (EBG) element, the CRM comprising a set of executable instructions configured to, when executed by at least one processor, cause the at least one processor to perform the steps of: receiving the 3D visualization file representing the EBG element; generating a file library having a plurality of files, each file representing a substantially 2D layer for printing the EBG element, and a metafile representing at least the printing order of each of the substantially 2D layers for printing; obtaining from the library a first file representing the first printing layer of the EBG element, the first file comprising printing instructions for a pattern representative of at least one of: the dielectric ink, and the conductive ink; using a first print head operable to dispense dielectric ink, included with the article of manufacture in communication with the at least one processor, forming the pattern corresponding to the dielectric ink in the first layer; using an electromagnetic radiation source included with the article of manufacture in communication with the at least one processor, curing the pattern corresponding to the dielectric ink in the first layer; using a second print head operable to dispense conductive ink, included with the article of manufacture in communication with the at least one processor, forming the pattern corresponding to the conductive ink in the first layer; using a focused heat source included with the article of manufacture in communication with the at least one processor, sintering the pattern corresponding to the conductive ink in the first layer; obtaining from the library a subsequent file representative of a subsequent layer for printing the EBG element; the subsequent file comprising printing instructions for a pattern representative of at least one of: the dielectric ink, and the conductive ink in the subsequent layer; repeating the steps of: forming the pattern corresponding to the dielectric ink in the subsequent layer, to the step of sintering the pattern corresponding to the conductive ink in the subsequent layer, wherein upon curing and/or sintering the final layer, the EBG element is configured to comprise: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises a facet wall extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore.

These and other features of the methods for direct and/or indirect inkjet printing of EBG elements and the structure of the EBG element, will become apparent from the following detailed description when read in conjunction with the figures and examples, which are exemplary, not limiting.

BRIEF DESCRIPTION OF THE FIGURES

For a better understanding of the structures of, and methods for direct and/or indirect inkjet printing of EBG elements, with regard to the exemplary implementations, examples and applications thereof, reference is made to the accompanying examples and figures, in which:

FIG. 1A illustrates a typical EBG element with mushroom-type conducting elements, 1B showing a schematic illustration of single tack-like radiating element, with FIG. 1C showing a Y-Z gross section of FIG. 1A along line A-A, and FIG. 1D is an equivalent circuit schematic of the unit cell of the EBG element illustrated in FIG. 1C;

FIG. 2, is a schematic illustration of a Y-Z cross section of a first exemplary implementation of an EBG element structure fabricated using the methods disclosed;

FIG. 3, is a schematic illustration of a Y-Z cross section of a first exemplary implementation of an EBG element structure fabricated using the methods disclosed; and FIG. 4A, is a schematic illustration of an exemplary implementation of the polygonal surface of the radiating element, with FIG. 4B illustrating another implementation of the polygonal radiating element.

DETAILED DESCRIPTION

Figures 1A, 1B, 1C, 1D:
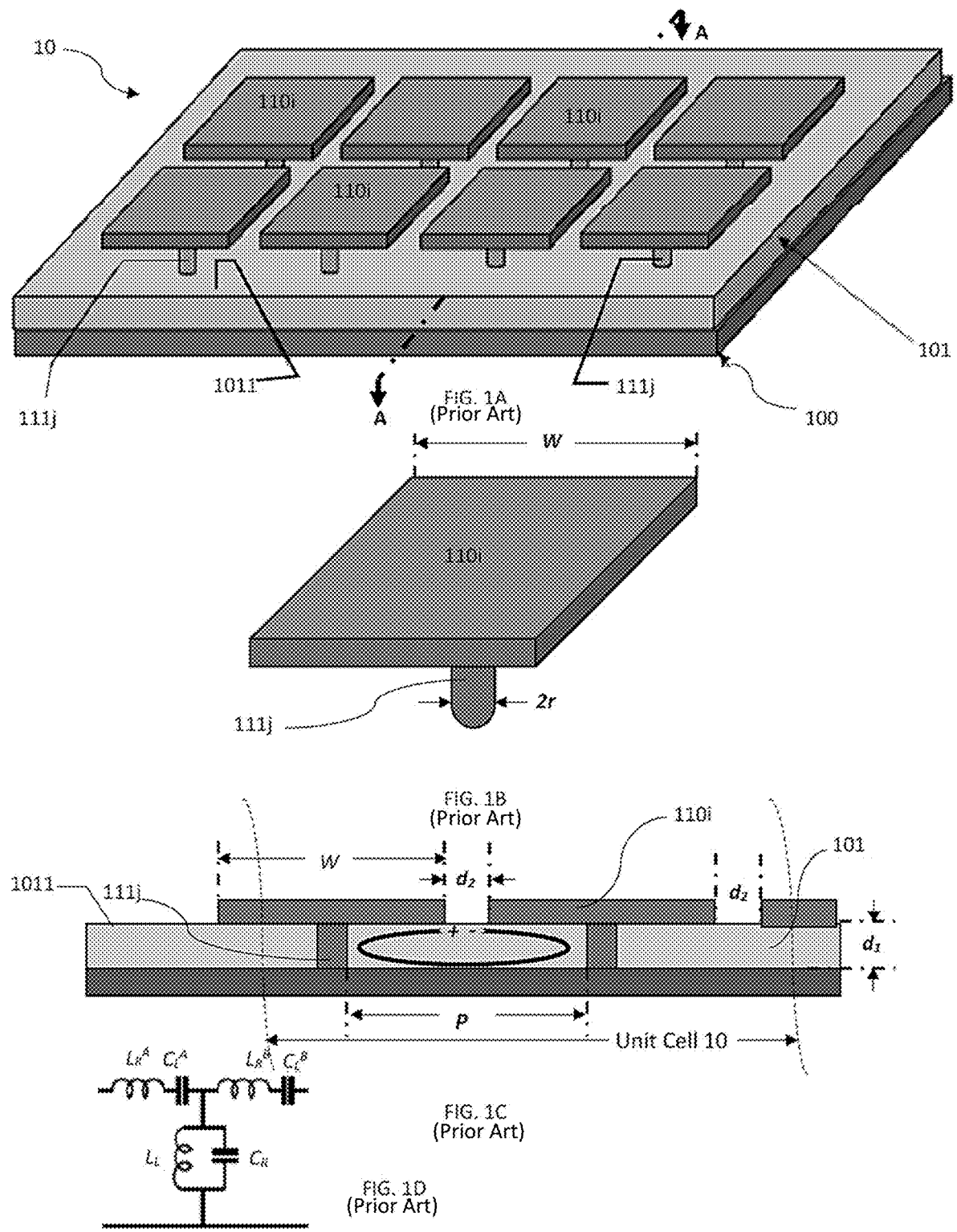
FIGS. 1A-1D represent prior art, where

Provided herein are exemplary implementations of structures of and methods for forming electromagnetic band gap (EBG) elements. Further, disclosed herein are methods for direct forming EBG elements using additively manufactured electronics (AME) having a structure of periodic mushroom-type cells enabling a reduced footprint for ISM B-type frequencies. A person skilled in the art of electronic circuits could also apply the exemplary implementations disclosed to multilayered printed circuit boards (PCBs) and flexible printed circuits (FPCs), telecommunication equipment, and Internet of Things components. Other circuits used in various applications requiring the EBG elements circuits are likewise contemplated, such as for example, wireless systems, radio frequency (RF), television and satellite broadcast, mobile communications, broadband microwave, millimeter-wave communication systems, radars and many other systems related to the information telecommunication.

As illustrated schematically in FIG. 1A, Mushroom-type EBG elements consist typically of dielectric medium (substrate) 101, metal patches 110i, ground plane 100, and connecting (blind, filled or plated) vias 111j. The EBG element is essentially operable as an LC Filter array or a parallel resonant circuit (See e.g., FIG. 1C). Inductance L is generated by a current loop within the element through blind vias 111j, while capacitance C is generated by the gap $d_2$ of two $i^{th}$ adjacent patches 110i. The values of the capacitance (C), inductance (L), bandwidth (c) and resonant frequency ($f_r$) are given by:

$$L = \frac{\mu_0}{2\pi} d_1 \times \left( \log\left(\frac{2d_1}{2r}\right) - 1 \right) \quad \text{(Equ. 1)}$$

$$C = \frac{W\varepsilon_0(1+\varepsilon_r)}{\pi} \cosh^{-1}\left(\frac{W+d_2}{d_2}\right) \quad \text{(Equ. 2)}$$

$$f_r = \frac{1}{2\pi\sqrt{LC}} \quad \text{(Eqn. 3)}$$

wherein $\mu_0$, $\varepsilon_0$, $\eta_0$; are permeability, permittivity, and impedance of free space respectively, $\varepsilon_r$ is the relative permittivity, $d_1$ is the via length (and/or the thickness of the dielectric medium), $d_2$ is the gap between adjacent patches, $2r$ is the via diameter, and W is patch width.

At resonance, the surface impedance $Z_s$ is determined by:

$$Z_s = \frac{j\omega L}{1 - \omega^2 LC} \quad \text{(Equ. 4)}$$

Assuming unit cell 10 is repeatedly disposed infinitely (See e.g., FIG. 4A, 4B) and periodically, the frequency band of signals to be blocked by EBG 10 is determined by using equation (5) below represented by the capacitors $C_L^A$ and $C_L^B$ and inductors $L_R^A$ and $L_R^B$ that are connected in series in an equivalent circuit and/or equation (6) below represented by the capacitor $C_R$ and inductor $L_L$ that are connected in parallel in an equivalent circuit, as described in, for example, in Atsushi Sanada, Christophe Caloz, Tatsuo Itoh, "*Planar Distributed Structures with Negative Reflective Index*", IEEE Transactions on Microwave Theory and Techniques, vol. 52, No. 4, pp. 1252-1263, (Apr. 13, 2004), incorporated herein by reference in its entirety.

$$\omega_{se} = \frac{1}{\sqrt{L_R C_L}} \quad \text{(Equ. 5)}$$

$$\omega_{sh} = \frac{1}{\sqrt{L_L C_R}} \quad \text{(Equ. 6)}$$

In the above equations, $\omega_{se}$ and $\omega_{sh}$ indicate the upper limit or lower limit respectively of the frequency band of signals to be blocked by EBG 10. If Equ.s (5) and (6) indicate that the product of $L_R$ and $C_L$ (referred to below as the $L_R C_L$ product) is constant and that the product of $L_L$ and $C_R$ (referred to below as the $L_L C_R$ product) is also constant, even if the size (width W of the $i^{th}$ patch 110i and/or length $d_1$ of the blind $j^{th}$ via 111j, for example) of the unit cell 10 is adjusted, the frequency band of signals to be blocked by EBG 10 remains unchanged. Conversely changing at least one of: the effective width W of $i^{th}$ patch 110i, the gap $d_2$ between adjacent patches 110i, blind via 111j diameter $2r$ (and thereby the pitch P of the periodicity), will inevitably alter both me, and Mh and hence the band gap blocked by EBG element 10.

Accordingly and in an exemplary implementation, provided herein is a computerized method of fabricating an electromagnetic band gap (EBG) element comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") having a central processing module (CPM), in communication with the conveyor, and each of the first, and second print heads, the CPM further comprising: at least one processor in communication with a non-transitory computer readable storage medium storing thereon instructions that, when executed by the at least one processor cause the CPM to control the ink-jet printing system, by carrying out steps that comprise: receiving a 3D visualization file representing the EBG element; and generating a file library having a plurality of files, each file representing a substantially 2D layer for printing the EBG element, and a metafile representing at least the printing order of each of the substantially 2D layers for printing; receiving the 3D visualization file representing the EBG element; generating the library of files representing the substantially 2D layer for printing; providing the dielectric ink composition, and the conductive ink composition; obtaining from the library a first file representing the first printing layer of the EBG element, the first file comprising printing instructions for a pattern representative of at least one of: the dielectric ink, and the conductive ink; using the first print head, forming the pattern corresponding to the dielectric ink in the first layer; curing the pattern corresponding to the dielectric ink in the first layer; using the second print head, forming the pattern corresponding to the conductive ink in the first layer; sintering the pattern corresponding to the conductive ink in the first layer; obtaining from the library a subsequent file representative of a subsequent layer for printing the EBG element; the subsequent file comprising printing instructions for a pattern representative of at least one of: the dielectric ink, and the conductive ink in the subsequent layer; repeating the steps of: using the first print head, forming the pattern corresponding to the dielectric ink in the subsequent layer, to the step of sintering the pattern corresponding to the conductive ink in the subsequent layer, wherein upon curing and/or sintering the final layer, the EBG element comprises: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises a facet wall extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore; and removing the substrate.

Alternatively, provided herein is a computerized method of fabricating an electromagnetic band gap (EBG) element comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") having a central processing module (CPM), in communication with the conveyor, and each of the first, and second print heads, the CPM further comprising: at least one processor in communication with a non-transitory computer readable storage medium storing thereon instructions that, when executed by the at least one processor cause the CPM to control the ink-jet printing system, by carrying out steps that comprise: receiving a 3D visualization file representing the EBG element; and generating a file library having a plurality of files, each file representing a substantially 2D layer for printing the EBG element, and a metafile representing at least the printing order of each of the substantially 2D layers for printing; receiving the 3D visualization file representing the EBG element; generating the library of files representing the substantially 2D layer for printing; providing the dielectric ink composition, and the conductive ink composition; obtaining from the library a first file representing the first printing layer of the EBG element, the first file comprising printing instructions for a pattern representative of at least one of: the dielectric ink, and the conductive ink; using the first print head, forming the pattern corresponding to the dielectric ink in the first layer; curing the pattern corresponding to the dielectric ink in the first layer; using the second print head, forming the pattern corresponding to the conductive ink in the first layer; sintering the pattern corresponding to the conductive ink in the first layer; obtaining from the library a subsequent file representative of a subsequent layer for printing the EBG element; the subsequent file comprising printing instructions for a pattern representative of at least one of: the dielectric ink, and the conductive ink in the subsequent layer; repeating the steps of: using the first print head, forming the pattern corresponding to the dielectric ink in the subsequent layer, to the step of sintering the pattern corresponding to the conductive ink in the subsequent layer, wherein upon curing and/or sintering the final layer, the EBG element comprises: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises a facet wall extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore; and removing the substrate.

In an exemplary implementation, the CPM is operable to generate, for each file representing the substantially 2D layer of dielectric ink pattern, to further generate a sub library of conductive ink pattern files, each conductive ink pattern file representing a substantially 2D layer for printing. Each of the sub library files of conductive patterns, can further comprise a metafile with at least one of: an order of printing, an identifier of the file of substantially 2D layer of dielectric ink pattern it is associated with, and instructions on at least one of: speed of printing, and printing order. It is noted, that the generated sub-library can comprise the number of files configured, once the final substantially 2D conductive ink pattern in the sub-library is sintered, to have the same thickness (or height) is the corresponding cured dielectric ink layer. For example, the sub-library can comprise between about 10 and about 55 files, each representing a substantial 2D layer of conductive ink for printing. In addition, the conductive ink pattern in each file can be identical, or at least one file can have a different pattern than another file in the sub library. Moreover, the thickness formed upon fabrication and sintering of the final substantially 2D conductive ink pattern, can be higher or lower than the surface of the cured substantially 2D layer of dielectric ink pattern printed. For example, in forming through hole, unfilled vias, it may be desirable to raise the upper surface of the through-hole, unfilled via above the dielectric layer thickness, to ensure electric contact between layers. Similarly, when forming wells for integrated circuit legs (e.g., J-legs), it may be advantageous to lower the conductive ink pattern below the surface of the dielectric ink layer.

A more complete understanding of the components, methods, and devices disclosed herein can be obtained by reference to the accompanying drawings. These figures (also referred to herein as "FIG.") are merely schematic representations based on convenience and the ease of demonstrating the present disclosure, and are, therefore, not intended to indicate relative size and dimensions of the devices or components thereof, their relative size relationship and/or to define or limit the scope of the exemplary implementations. Although specific terms are used in the following description for the sake of clarity, these terms are intended to refer only to the particular structure of the exemplary implementations selected for illustration in the drawings, and are not intended to define or limit the scope of the disclosure. In the drawings and the following description below, it is to be understood that like numeric designations refer to components of like function. Likewise, cross sections are referred to on normal orthogonal coordinate apparatus having XYZ axis, such that Y axis refers to front-to-back, X axis refers to side-to-side, and Z axis refers to up-and-down.

As illustrated in FIG. 2, in the methods provided, using the disclosed systems and upon curing and/or sintering the final layer, electromagnetic band gap (EBG) element 20 comprises: an electrically conducting ground plane 100 having apical surface 1001 and basal surface 1002, with dielectric medium (interchangeable with substrate) 101 having basal surface 1012 and apical surface 1011 disposed over electrically conducting ground plane 100. Also shown are plurality of polygonal conducting elements (interchangeable with patches) 110$i$ each $i^{th}$ patch 110$i$ having apical surface 1105 and basal surface 1106 disposed adjacently to, and distanced from each other $i^{th}$ patch 110$i$ on apical surface 1011 of the dielectric medium, each $i^{th}$ polygonal conducting element 110$i$ further comprises at least two (diametrically) opposing facet wall(s) 1102 extending basally, wherein each $i^{th}$ polygonal conducting element 110$i$ is coupled to electrically conducting ground plane 100 by blind via 111$j$; and plurality of gapping polygonal structures 1003$j$ each $j^{th}$ gapping polygonal structure 1003$j$ associated with $i^{th}$ polygonal conducting element 110$i$ and having apical surface 1005, gapping polygonal structure 1003$j$ extending apically from apical surface 1001 of electrically conducting ground plane 100 and are conducting structures forming protruding extensions of conducting ground plane 100, wherein each j$^{th}$ gapping polygonal structures 1003$j$ defining concentric bore 1004$j$ wherein blind via 111$j$ is disposed coaxial with bore 1004$j$. It stands to reason then, that each i$^{th}$ polygonal conducting element 110$i$ has an even number of facets (sides), including at least two (diametrically) opposing facet wall(s) 1102 extending basally (in other words, extend from upper slab member 110$l$ toward electrically conducting ground plane 100 to predetermined depth U within dielectric medium 101, effectively increasing size W of i$^{th}$ polygonal conducting element 110$i$ thereby affecting the capacitance $C_L$, as well as inductance $L_R$.

As illustrated in FIG. 2, each i$^{th}$ polygonal conducting element 110$i$ is distanced from an adjacent i$^{th}$ polygonal conducting element 110$i$ by a predetermined distance $t_1$. As indicated initially, $t_1$, is equivalent (in function, not necessarily size) to gap $d_2$, affecting (see e.g., Equ. 2) $C_L$ of EBG element 20. Furthermore, each j$^{th}$ gapping polygonal structure 1003$j$, which extends apically from apical face 1001 of electrically conducting ground plane 100 to a predetermined gap $g_1$ between apical surface 1005 of each j$^{th}$ gapping polygonal structure 1003$j$ and basal surface 1106 of associated i$^{th}$ polygonal conducting element 110$i$. In EBG element 20, $g_1$ is equivalent in function to $d_1$ in FIG. 1C, which as can be seen from Equ.'s 1, and 2, affect both capacitance $C_R$ and inductance $L_L$, thus providing a way to decrease the gap without compromising the size of i$^{th}$ polygonal conducting element 110$i$ and as evident from Equ. 6, and 7, modulating the band gap blocked by EBG 20. Accordingly and in an exemplary implementation, $g_1$ is operable to define a predetermined lower frequency $\omega_{sh}$ limit to be blocked by EBG element 20. Similarly, predetermined depth U within dielectric medium 101, to which at least two (diametrically) opposing facet wall(s) 1102 extend and $t_1$, the distanced between adjacent polygonal conducting elements 110$i$ are together operable to define a predetermined upper frequency limit to be blocked by the EBG element.

In the context of the disclosure, the term "operable" means a certain element or step, the system and/or the device and/or the program, is sized, adapted and calibrated, fully functional, comprises elements for, and meets applicable operability requirements to perform a recited function when disposed, activated, coupled, implemented, actuated, effected, realized, or when an executable program is executed by at least one processor associated with the system and/or the device. In relation to systems and circuits, the term "operable", as used herein, means the system and/or the circuit is fully functional and calibrated, comprises logic for, having the hardware and firmware necessary, as well as the circuitry for, and meets applicable operability requirements to perform a recited function when executed by at least one processor.

Turning now to FIG. 3, illustrating another exemplary configuration of the EBG elements fabricated using the AME methods disclosed. As illustrated in FIG. 3, EBG element 30 comprises (in addition to the components illustrated in FIG. 2, and their effect on the band gap); at least one facet wall 1102 of each i$^{th}$ polygonal conducting element 110$i$ (for example, one of the least two (diametrically) opposing facet wall(s) 1102, 1102' extending basally) further comprises pair 1103, 1103' of laterally extending and vertically overlapping (in other words, one 1103 overt the other 1103') identical (in size) slabs, disposed at predetermined vertical distance $d_4$ from each other, wherein pair of slabs 1103, 1103' are embedded within dielectric medium 101 and are extending laterally to cover a portion of distance $t_2$ to adjacent i$^{th}$ polygonal conducting element 110$i$; and complementary slab 1104 extending laterally from facet wall 1102' diametrically opposing facet wall 1102 with pair of laterally extending identical slabs 1103, 1103', wherein adjacent polygonal conducting elements 110$i$ are arranged such that complementary slab 1104 is interdisposed between, and overlaps with pair of laterally extending and vertically overlapping identical slabs 1103, 1103' at predetermined gap $g_2$, between the upper surface of complementary slab 1104 and the lower surface of upper slab 1103 of pair of laterally extending and vertically overlapping identical slabs 1103, 1103'. As illustrated in FIG. 3, $g_2$, is functionally equivalent to $t_1$ in EBG element 20, thereby allowing modulation of CL by altering $g_2$. Accordingly and in another exemplary configuration, $g_2$, the predetermined gap between the upper surface of complementary slab 1104 and the lower surface of upper slab 1103 of pair of laterally extending and vertically overlapping identical slabs 1103, 1103' is operable to define a predetermined upper frequency limit $\omega_{se}$ to be blocked by the EBG element.

As further illustrated in FIG. 3, complementary slab 1104 overlaps $A_1$ with pair of laterally extending and vertically overlapping identical slabs 1103, 1103' over between about 60% and about 99% of the surface area defined by the surfaces of pair of laterally extending and vertically overlapping identical slabs 1103, 1103'. For example, the overlap can be between about 65% and about 85%, or between about 70% and about 80%.

Turning now to FIGS. 4A, 4B, illustrating exemplary implementations of EBG elements disclosed. As indicated, to create the unit cells disclosed, at least two opposing walls are used to create the periodic cells, such that the polygonal conducting elements are coupled to form the band gap leading to an even number of facets. Likewise, to maintain the proper pitch, each conducting gapping polygonal structures 1003$j$ form a basally closed, hollow bore 1004 with peripheral walls that have the same number of facets as the polygonal conducting elements.

Additionally, or alternatively. in the methods provided, using the disclosed systems and upon curing and/or sintering the final layer, each j$^{th}$ blind via 11$l$j, and bore 1004 are coaxial. In this context, the term 'coaxial' means each j$^{th}$ blind via 111$j$ has a common propagation axis with bore 1004.

In certain exemplary implementations, each j$^{th}$ blind via 111$j$ initiating at either the apical external layer, or the basal external layer; and terminate at conducting ground plane 100, is referred to as a "blind via"

While reference is made herein to inkjet inks and their dispensing systems, other additive manufacturing (AM) methods are also contemplated in the implementation of the disclosed methods. In the exemplary implementation, the EBG Element can likewise be fabricated by a selective laser sintering (SLS) process, although any other suitable additive manufacturing process (also known as rapid prototyping, rapid manufacturing, and 3D printing methods) may also be used, either alone or in combination. These can be, for example, direct metal laser sintering (DMLS), electron beam melting (EBM), selective heat sintering (SHS), or stereolithography (SLA).

The EBG Element may be fabricated from any suitable additive manufacturing material, such as metal powder(s) (e.g., silver, gold, cobalt chrome, steels, aluminum, titanium and/or nickel alloys), gas atomized metal powder(s), thermoplastic powder(s) (e.g., polylactic acid (PLA), acrylonitrile butadiene styrene (ABS), and/or high-density polyethylene (HDPE)), photopolymer resin(s) (e.g., UV-curable photopolymers such as, for example PMMA), thermoset resin(s), thermoplastic resin(s), or any other suitable material that enables the functionality as described herein.

Depending on the metal particles' type (e.g., silver, copper, gold, aluminum, etc.) and aspect ratio (referring to the ratio between the metal particle's length and its respective thickness or diameter), in conductive ink compositions used for inkjet printing, maximum theoretical conductivity attainable may be a fraction of the same metal's bulk conductivity, for example, between about 10% and about 90%, or between about 20% and about 80%, or, in yet another example, between about 30% and about 70%, or 50%, when compared to pure bulk metal.

For example, the conductive material used to form $i^{th}$ polygonal conducting element 110$i$, conducting ground plane 100, and conducting gapping polygonal structures 1003$j$ is a silver nanoparticle. In the context of the disclosure, nanoparticles are defined as particles with a volume average particle size ($D_{3,2}$, which can be central to obtaining the proper aspect ratio, in other words, R>>1, for example between 3:1 and 10:1), below 1 micrometer, for example below about 0.5 micrometer, or below about 0.2 micrometer. Nanoparticles may be advantageous for ink jet printing applications, enabling low ink viscosities even with a very high conductive material content or loading (thus ensuring exceeding the 2D and 3D site percolation thresholds), as well as preventing clogging of nozzles on the inkjet printhead dispenser.

In an exemplary implementation, the term "dispensing", in the context of the print heads used for fabricating the EBG Elements disclosed herein, can be used to designate the operation of the device from which the ink drops are dispensed, such as the print head acting as a dispenser. The dispenser can be, for example an apparatus for dispensing small quantities of liquid including micro-valves, piezoelectric dispensers, continuous-jet print-heads, boiling (bubble-jet) dispensers, and others affecting the temperature and properties of the fluid flowing through the dispenser. In an exemplary implementation, the term "print head" and the term "dispenser" are interchangeable.

The method of forming the EBG Elements using the computerized ink jet printing systems disclosed herein can comprise a step of providing a substrate (e.g., a peelable substrate such as a film). The print head (and derivatives thereof; are to be understood to refer to any device or technique that deposits, transfers or creates material on a surface in a controlled manner) depositing the dielectric ink, can be configured to provide the ink droplet(s) upon demand, in other words, as a function of various process parameters such as conveyor speed, desired AME sub-layer thickness, whether the blind via, is filled or plated, or their combination.

The substrate, used in the computerized ink jet printing systems disclosed herein can be, for example removable or peelable, can also be a relatively rigid material, for example, glass or crystal (e.g., sapphire), Alternatively, the substrate may be a flexible (e.g., rollable) substrate (or film) to allow for an easy peeling of the substrate from the AME, for example, poly(ethylenenaphthalate) (PEN), polyimide (e.g. KAPTONE® by DuPont), silicon polymers, poly(ethyleneterephtalate) (PET), poly(tetrafluoroethylene) (PTFE) films etc.

Other functional steps (and therefore means for affecting these steps) may be taken when using the computerized ink jet printing systems disclosed herein before or after the first or second print heads (e.g., for sintering the conductive layer). These steps may include (but not limited to): a heating step (affected by a heating element such as a chuck, and/or hot air); photobleaching (using e.g., a UV light source and a photo mask); drying (e.g., using vacuum region, or heating element); (reactive) plasma deposition (e.g., using pressurized plasma gun and a plasma beam controller); cross linking (e.g., by selectively initiated through the addition of a photoacid such as {4-[(2-hydroxytetradecyl)-oxyl]-phenyl}-phenyliodonium hexafluoro antimonate to a polymer solutions prior to coating or used as dispersant with the metal precursor or nanoparticles); annealing, or facilitating redox reactions.

Formulating the conductive and/or dielectric ink composition(s), when using the computerized ink jet printing systems disclosed herein may take into account the requirements, if any, imposed by the deposition tool and the surface characteristics (e.g., at least one of hydrophilic or hydrophobic, and the surface energy) of the (optionally removable) substrate. Using ink-jet printing with a piezo head for example, the viscosity of either the conductive ink and/or dielectric ink (measured at 20° C.) can be, for example, not lower than about 5 cP, e.g., not lower than about 8 cP, or not lower than about 10 cP, and not higher than about 30 cP, e.g., not higher than about 20 cP, or not higher than about 15 cP. The conductive ink, and/or dielectric ink can each be configured (e.g., formulated) to have a dynamic surface tension (referring to a surface tension when an ink-jet ink droplet is formed at the print-head aperture) of between about 25 mN/m and about 35 mN/m, for example between about 29 mN/m and about 31 mN/m measured by maximum bubble pressure tensiometry at a surface age of 50 ms and at 25° C. The dynamic surface tension can be formulated to provide a contact angle with the peelable substrate or the dielectric layer(s) of between about 100° and about 165°.

In an exemplary implementation, the ink-jet ink systems compositions and methods for forming EBG Element, can be patterned by expelling droplets of the liquid ink-jet ink provided herein from an orifice one-at-a-time, as the print-head (or the substrate/chuck) is maneuvered, for example in two (X-Y) (it should be understood that the print head can also move in the Z axis) dimensions at a predetermined distance above the substrate or any subsequent layer. The ink-jet print heads provided used in the methods described herein can provide a minimum layer film thickness equal to or less than about 3 µm-10,000 µm In an exemplary implementation, the volume of each droplet of the conductive ink, and/or the dielectric ink, can range from 0.5 to 300 picoLiter (pL), for example 1-4 pL and depended on the strength of the driving pulse and the properties of the ink. The waveform to expel a single droplet can be a 10 V to about 70 V pulse, or about 16V to about 20V, and can be expelled at frequencies between about 5 kHz and about 500 kHz.

The dielectric ink compositions described herein can have in addition, a continuous phase comprising: a cross-linking agent, a co-monomer, a co-oligomer, co-polymer or a composition comprising one or more of the foregoing. Likewise, the oligomer and/or polymer backbone can be induced to form cross links by contacting the polymer with an agent that will form free radicals on the backbone, thereby allowing for cross-linking sites. In an exemplary implementation, the cross-linking agent, co-monomer, co-oligomer, co-polymer or a composition comprising one or more of the foregoing can be a part, or configured to form a solution, emulsion, gel or suspension within the continuous phase.

In an exemplary implementation, the continuous phase used in the AMEs (FPCs and HDI circuits) fabricated using the disclosed methods for forming an EBG element, can comprise: multifunctional acrylate monomer, oligomer, polymer or their combination; a cross-linking agent; and a radical photoinitiator, and can be partially or entirely soluble in the continuous phase.

Initiating the dielectric resin backbone polymerization can be done using an initiator, for example benzoyl peroxide (BP) and other peroxide-containing compounds. The term "initiator" as used herein generally refers to a substance that initiates a chemical reaction, specifically any compound which initiates polymerization, or produces a reactive species which initiates polymerization, including, for example and without limitation, co-initiators and/or photoinitiator(s).

In another exemplary implementation, the dielectric resin used in the ink compositions described, comprises active and/or live components of a polymer capable of undergoing photoinitiation using a photoinitiator. Such live monomer, live oligomer, live polymer or their combination capable of undergoing photoinitiation can be for example, multifunctional acrylates, for example a multifunctional acrylate that can be multifunctional acrylate is selected from the group consisting of 1,2-ethanediol diacrylate, 1,3-propanediol diacrylate, 1,4-butanediol diacrylate, 1,6-hexanediol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol-A-diglycidyl ether diacrylate, hydroxypivalic acid neopentanediol diacrylate, ethoxylated bisphenol-A-diglycidyl ether diacrylate, polyethylene glycol diacrylate, trimethylolpropane triacrylate, ethoxylated trimethylolpropane triacrylate, propoxylated trimethylolpropane triacrylate, propoxylated glycerol triacrylate, tris(2-acryloyloxyethyl) isocyanurate, pentaerythritol triacrylate, ethoxylated pentaerythritol triacrylate, pentaerythritol tetraacrylate, ethoxylated pentaerythritol tetraacrylate, ditrimethylolpropane tetraacrylate, dipentaerythritol pentaacrylate and dipentaerythritol hexaacrylate.

Photoinitiators that can be used with the multifunctional acrylates described herein can be, for example radical photoinitiator. These radical photoinitiators can be, for example Irgacure® 500 from CIBA SPECIALTY CHEMICAL and Darocur® 1173, Irgacure® 819, Irgacure® 184, TPO-L (ethyl(2,4,6, trimethyl benzoil) phenyl phosphinate) benzophenone and acetophenone compounds and the like. For example, the radical photoinitiator can be cationic photoinitiator, such as mixed triarylsulfonium hexafluoroantimonate salts. Another example of the radical photoinitiator used in the active continuous phase described herein, can be 2-ispropylthioxanthone.

The terms "live monomer", "live oligomer", "polymer" or their counterparts (co-monomer e.g.,) combination refers in an exemplary implementation to a monomer, a short group of monomers or a polymer having at least one functional group capable of forming a radical reaction (in other words, the reaction can be continued and is not otherwise terminated by an end-group).

The cross-linking agent used in the compositions, systems and methods described herein, for forming EBG Element, can be, for example, a primary or secondary polyamine and adducts thereof, or in another example, an anhydride, a polyamide, a $C_4$-$C_{30}$ polyoxyalkylene in which the alkylene groups each independently comprise 2 to 6 carbon atoms, or a composition comprising one or more of the foregoing.

The conductive and/or the dielectric ink compositions, may each require the presence of a surfactant and optionally a cosurfactants. The surfactants and/or cosurfactants may be cationic surfactants, anionic surfactants, non-ionic surfactant and amphiphilic copolymers, such as block copolymers.

Moreover, the dielectric (insulating) layer portion can have a substantially uniform thickness throughout, thereby creating a substantially planar (e.g., flat) surface for receiving an additional conductive circuit pattern. The dielectric layer may be an UV curable adhesive or other polymer material. For example, the dielectric ink comprises a UV curable polymer. Other dielectric polymers such as, for example, polyester (PES), polyethylene (PE), polyvinyl alcohol (PVOH) and poly-methyl methacrylate (PMMA), Poly(vinylpirrolidone) (PVP, water soluble and may be beneficial not to clog the print head orifice). Other dielectric materials can be photoresistive polymers, for example, SU-8 based polymers, polymer-derived ceramics or their combination and copolymers can also be used.

In an exemplary implementation, the step of curing is separate and distinct from the step of sintering. Accordingly, curing is affected ion certain exemplary implementations by exposing the printed dielectric pattern to electromagnetic radiation in a predetermined wavelength of between about 196 nm and about 400 nm, for example, between about 300 nm and about 400 nm, or between about 350 nm and about 380 nm. Conversely, sintering is affected by exposing the conductive pattern printed to a focused heat source, such as for example, an IR focused lamp, or a laser beam operable to follow the conductive pattern.

The ink-jet systems used to implement the methods provided herein, can further comprises a computer aided manufacturing ("CAM") module, the module comprising a data processor such as a central processing module (CPM) in communication with a non-transitory memory storage device storing thereon a computer readable medium (CRM) for fabricating an electromagnetic band gap (EBG) element, the CRM comprising a set of executable instructions configured to, when executed by at least one processor, cause the at least one processor to perform the steps of: receiving the 3D visualization file representing the EBG element; generating a file library having a plurality of files, each file representing a substantially 2D layer for printing the EBG element, and a metafile representing at least the printing order of each of the substantially 2D layers for printing; obtaining from the library a first file representing the first printing layer of the EBG element, the first file comprising printing instructions for a pattern representative of at least one of: the dielectric ink, and the conductive ink; using a first print head operable to dispense dielectric ink, included with the article of manufacture in communication with the at least one processor, forming the pattern corresponding to the dielectric ink in the first layer; using an electromagnetic radiation source included with the article of manufacture in communication with the at least one processor, curing the pattern corresponding to the dielectric ink in the first layer; using a second print head operable to dispense conductive ink, included with the article of manufacture in communication with the at least one processor, forming the pattern corresponding to the conductive ink in the first layer; using a focused heat source included with the article of manufacture in communication with the at least one processor, sintering the pattern corresponding to the conductive ink in the first layer; obtaining from the library a subsequent file representative of a subsequent layer for printing the EBG element; the subsequent file comprising printing instructions for a pattern representative of at least one of: the dielectric ink, and the conductive ink in the subsequent layer; repeating the steps of: forming the pattern corresponding to the dielectric ink in the subsequent layer, to the step of sintering the pattern corresponding to the conductive ink in the subsequent layer, wherein upon curing and/or sintering the final layer, the EBG element is configured to comprise: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises at least two opposing facet walls extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore.

The CAM module can therefore comprise: a 2D file library storing the files derived from the 3D visualization files of the EBG element. The term "library, as used herein, refers to the collection of 2D layer files derived from the 3D visualization file, containing the information necessary to print each conductive and dielectric pattern, which is accessible and used by the data collection application, which can be executed by the computer-readable media. The CAM further comprises at least one processor in communication with the library; a non-transitory storage device storing a set of operational instructions for execution by the processor; a micromechanical ink-jet print head or heads in communication with the processor and with the library; and a print head (or, heads') interface circuit in communication with the 2D file library, the non-transitory storage device and the micromechanical inkjet print head or heads, the 2D file library operable to provide operation parameters to the printer, specific to a functional (printed) layer.

In certain exemplary implementations, the library comprises files representative of dielectric patterns only, conductive patterns only (for example, for formation of each $i^{th}$ polygonal conducting element 110$i$), or a layer file comprising both dielectric and conductive patterns. In layers comprising both dielectric and conductive patterns, the metafile created by the executable set of instructions included with the system, stored on the memory storage device, will further prioritize which pattern will be printed first and the curing or sintering sequence.

The 3D visualization file representing the EBG element, can be: an an ODB, an ODB++, an.asm, an STL, an IGES, a STEP, a Catia, a SolidWorks, a Autocad, a Creo, a 3D Studio, a Gerber, a Rhino a Altium, an Orcad, an or a file comprising one or more of the foregoing; and wherein file that represents at least one, substantially 2D layer (and uploaded to the library) can be, for example, a JPEG, a GIF, a TIFF, a BMP, a PDF file, or a combination comprising one or more of the foregoing.

In addition, the computer program, can comprise program code means for carrying out the steps of the methods described herein, as well as a computer program product comprising program code means stored on a medium that can be read by a computer. Non-transitory storage device(s) as used in the methods described herein can be any of various types of non-volatile memory devices or storage devices (in other words, memory devices that do not lose the information thereon in the absence of power). The term "memory device" is intended to encompass an installation medium, e.g., a CD-ROM, floppy disks, or tape device or a non-volatile memory such as a magnetic media, e.g., a hard drive, optical storage, or ROM, EPROM, FLASH, etc. The memory device may comprise other types of memory as well, or combinations thereof. In addition, the memory medium may be located in a first computer in which the programs are executed (e.g., the 3D inkjet printer provided), and/or may be located in a second different computer which connects to the first computer over a network, such as the Internet. In the latter instance, the second computer may further provide program instructions to the first computer for execution. The term "memory device" can also include two or more memory devices which may reside in different locations, e.g., in different computers that are connected over a network. Accordingly, for example, the bitmap library can reside on a memory device that is remote from the CAM module coupled to the 3D inkjet printer provided, and be accessible by the 3D inkjet printer provided (for example, by a wide area network)

The use of the term "module" does not imply that the components or functionality described or claimed as part of the module are all configured in a (single) common package. Indeed, any or all of the various components of a module, whether control logic or other components, can be combined in a single package or separately maintained and can further be distributed in multiple groupings or packages or across multiple (remote) locations and devices. Furthermore, in certain exemplary implementations, the term "module" refers to a monolithic or distributed hardware unit.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives.

Unless specifically stated otherwise, as apparent from the following discussions, it is appreciated that throughout the specification discussions utilizing terms such as "processing," "loading," "in communication," "detecting," "calculating," "determining", "analyzing," or the like, refer to the action and/or processes of a computer or computing system, or similar electronic computing device, that manipulate and/or transform data represented as physical, such as a transistor architecture into other data similarly represented as physical structural (in other words, resin or metal/metallic) layers.

The Computer-Aided Design/Computer-Aided Manufacturing (CAD/CAM) generated information associated with the AME including built-in passive and embedded active components described herein to be fabricated, which is used in the methods, programs and libraries can be based on converted CAD/CAM data packages can be, for example, IGES, DXF, DWG, DMIS, NC files, GERBER® files, EXCELLON®, STL, EPRT files, an ODB, an ODB++, an.asm, an STL, an IGES, a STEP, a Catia, a SolidWorks, a Autocad, a ProE, a 3D Studio, a Gerber, a Rhino a Altium, an Orcad, an Eagle file or a package comprising one or more of the foregoing. Additionally, attributes attached to the graphics objects transfer the meta-information needed for fabrication and can precisely define the PCBs. Accordingly and in an exemplary implementation, using pre-processing algorithm, GERBER®, EXCELLON®, DWG, DXF, STL, EPRT ASM, and the like as described herein, are converted to 2D files.

All ranges disclosed herein are inclusive of the endpoints, and the endpoints are independently combinable with each other. "Combination" is inclusive of blends, mixtures, alloys, reaction products, and the like. The terms "a", "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the element(s) includes one or more element).

Reference throughout the specification to "one exemplary implementation", "another exemplary implementation", "an exemplary implementation", and so forth, when present, means that a particular element (e.g., feature, structure, and/or characteristic) described in connection with the exemplary implementation is included in at least one exemplary implementation described herein, and may or may not be present in other exemplary implementations. In addition, it is to be understood that the described elements may be combined in any suitable manner in the various exemplary implementations.

Furthermore, the terms "first," "second," and the like, herein do not denote any order, quantity, or importance, but rather are used to denote one element from another.

Likewise, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

Accordingly and in an exemplary implementation, provided herein is a computerized method of fabricating an electromagnetic band gap (EBG) element comprising: providing an ink jet printing system comprising: a first print head, sized and configured to dispense a dielectric ink composition; a second print head sized and configured to dispense a conductive ink composition; a conveyor, operably coupled to the first, and the second print heads configured to convey a substrate to each of the first, and the second print heads; and a computer aided manufacturing ("CAM") having a central processing module (CPM), in communication with conveyor, and each of the first, and second print heads, the CPM further comprising: at least one processor in communication with a non-transitory computer readable storage medium storing thereon instructions that, when executed by the at least one processor cause the CPM to control the ink-jet printing system, by carrying out steps that comprise: receiving a 3D visualization file representing the EBG element; and generating a file library having a plurality of files, each file representing a substantially 2D layer for printing the EBG element, and a metafile representing at least the printing order of each of the substantially 2D layers for printing; receiving the 3D visualization file representing the EBG element; generating the library of files representing the substantially 2D layer for printing; providing the dielectric ink composition, and the conductive ink composition; obtaining from the library a first file representing the first printing layer of the EBG element, the first file comprising printing instructions for a pattern representative of at least one of: the dielectric ink, and the conductive ink; using the first print head, forming the pattern corresponding to the dielectric ink in the first layer; curing the pattern corresponding to the dielectric ink in the first layer; using the second print head, forming the pattern corresponding to the conductive ink in the first layer; sintering the pattern corresponding to the conductive ink in the first layer; obtaining from the library a subsequent file representative of a subsequent layer for printing the EBG element; the subsequent file comprising printing instructions for a pattern representative of at least one of: the dielectric ink, and the conductive ink in the subsequent layer; repeating the steps of: using the first print head, forming the pattern corresponding to the dielectric ink in the subsequent layer, to the step of sintering the pattern corresponding to the conductive ink in the subsequent layer, wherein upon curing and/or sintering the final layer, the EBG element comprises: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises at least two opposing facet walls extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore; and removing the substrate, wherein (i) the step of: using the CPM, generating a file library having a plurality of files, each file representing a substantially 2D layer for printing the EBG element, further comprises: for each file representing the substantially 2D layer of dielectric ink pattern, generating a sub library of conductive ink pattern files, each conductive ink pattern file in the sub-library representing a substantially 2D layer for printing, and a metafile with at least one of: an order of printing, an identifier of the file of substantially 2D layer of dielectric ink pattern file the sub-library conductive file is associated with, and instructions on the speed of printing, wherein upon curing and/or sintering the final layer (ii) each facet wall extends basally to a predetermined depth U within the dielectric medium, (iii) each polygonal conducting element is distanced from an adjacent conducting element by a predetermined distance $t_1$, (iv) each polygonal gapping structure extends apically from the apical face of the electrically conducting ground plane to a predetermined gap g1 between the apical surface of the polygonal gapping structure and the basal surface of the associated polygonal conducting element, (v) $g_1$ is operable to define a predetermined lower frequency limit to be blocked by the EBG element, (vi) U and $t_1$ are together operable to define a predetermined upper frequency limit to be blocked by the EBG element, (vii) at least one facet wall of each polygonal conducting element further comprises pair of laterally extending and vertically overlapping identical slabs, disposed at a predetermined vertical distance from each other, wherein the pair of slabs, embedded within the dielectric medium are extending laterally to cover a portion of the distance to the adjacent polygonal conducting element; and a complementary slab extending laterally from a facet wall diametrically opposing the facet wall with the pair of laterally extending identical slabs, wherein adjacent polygonal conducting elements are arranged such that the complementary slab is interdisposed between, and overlaps with the pair of laterally extending and vertically overlapping identical slabs at a predetermined gap g2, between the upper surface of the complementary slab and the lower surface of the upper slab of the pair of laterally extending and vertically overlapping identical slabs, (viii) $g_2$ is operable to define a predetermined upper frequency limit to be blocked by the EBG element, (ix) the complementary slab overlaps with the pair of laterally extending and vertically overlapping identical slabs over between about 60% and about 99% of the surface area of the pair of laterally extending and vertically overlapping identical slabs, and (x) the gapping polygonal structures has the same number of facets as the polygonal conducting elements.

In another exemplary implementation, provided herein is an electromagnetic band gap (EBG) element comprising: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises at least two opposing facet walls extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore, wherein (xi) each facet wall extends basally to a predetermined depth U within the dielectric medium, (xii) each polygonal conducting element is distanced from an adjacent conducting element by a predetermined distance $t_1$, (xiii) each polygonal gapping structure extends apically from the apical face of the electrically conducting ground plane to a predetermined gap $g_1$ between the apical surface of the polygonal gapping structure and the basal surface of the associated polygonal conducting element, (xiv) $g_1$ is operable to define a predetermined lower frequency limit to be blocked by the EBG element, (xv) L and t are together operable to define a predetermined upper frequency limit to be blocked by the EBG element, wherein (xvi) at least one facet wall of each polygonal conducting element further comprises pair of laterally extending and vertically overlapping identical slabs, disposed at a predetermined vertical distance from each other, wherein the pair of slabs, embedded within the dielectric medium are extending laterally to cover a portion of the distance to the adjacent polygonal conducting element; and a complementary slab extending laterally from a facet wall diametrically opposing the facet wall with the pair of laterally extending identical slabs, wherein adjacent polygonal conducting elements are arranged such that the complementary slab is interdisposed between, and overlaps with the pair of laterally extending and vertically overlapping identical slabs at a predetermined gap $g_2$, between the upper surface of the complementary slab and the lower surface of the upper slab of the pair of laterally extending and vertically overlapping identical slabs, wherein (xvii) $g_2$ is operable to define a predetermined upper frequency limit to be blocked by the EBG element, wherein (xviii) the complementary slab overlaps with the pair of laterally extending and vertically overlapping identical slabs over between about 60% and about 99% of the surface area of the pair of laterally extending and vertically overlapping identical slabs, and wherein (xix) the gapping polygonal structures has the same number of facets as the polygonal conducting elements.

In yet another exemplary implementation, provided herein is an article of manufacture comprising a non-transitory memory storage device storing thereon a computer readable medium (CRM) for fabricating an electromagnetic band gap (EBG) element, the CRM comprising a set of executable instructions configured to, when executed by at least one processor, cause the at least one processor to perform the steps of: receiving the 3D visualization file representing the EBG element; generating a file library having a plurality of files, each file representing a substantially 2D layer for printing the EBG element, and a metafile representing at least the printing order of each of the substantially 2D layers for printing; obtaining from the library a first file representing the first printing layer of the EBG element, the first file comprising printing instructions for a pattern representative of at least one of: the dielectric ink, and the conductive ink; using a first print head, in communication with the at least one processor, operable to dispense dielectric ink, included with the article of manufacture in communication with the at least one processor, forming the pattern corresponding to the dielectric ink in the first layer; using an electromagnetic radiation source in communication with the at least one processor, curing the pattern corresponding to the dielectric ink in the first layer; using a second print head operable to dispense conductive ink, in communication with the at least one processor, forming the pattern corresponding to the conductive ink in the first layer; using a focused heat source in communication with the at least one processor, sintering the pattern corresponding to the conductive ink in the first layer; obtaining from the library a subsequent file representative of a subsequent layer for printing the EBG element; the subsequent file comprising printing instructions for a pattern representative of at least one of: the dielectric ink, and the conductive ink in the subsequent layer; repeating the steps of: forming the pattern corresponding to the dielectric ink in the subsequent layer, to the step of sintering the pattern corresponding to the conductive ink in the subsequent layer, wherein upon curing and/or sintering the final layer, the EBG element is configured to comprise: an electrically conducting ground plane having an apical surface and a basal surface a dielectric medium having a basal surface and an apical surface disposed over the electrically conducting ground plane; a plurality of polygonal conducting elements each having an apical surface and a basal surface disposed adjacently to, and distanced from each other on the apical surface of the dielectric medium, each polygonal conducting element further comprises at least two opposing facet walls extending basally, wherein each conducting element is coupled to the electrically conducting ground plane by a blind via; and a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore, wherein (xx) in generating the file library having a plurality of files, each file representing a substantially 2D layer for printing the EBG element, the set of executable instructions is further configured to, when executed by at least one processor, cause the at least one processor to: for each file representing the substantially 2D layer of dielectric ink pattern, generate a sub library of conductive ink pattern files, each file of conductive ink pattern in the sub-library representing a substantially 2D layer for printing, and a metafile with at least one of: an order of printing, an identifier of the file of substantially 2D layer of dielectric ink pattern file the sub-library conductive file is associated with, and instructions on the speed of printing.

The above examples and description have of course been provided only for the purpose of illustration, and are not intended to limit the disclosed technology in any way. As will be appreciated by the skilled person, the disclosed technology can be carried out in a great variety of ways, employing more than one technique from those described above, all without exceeding the scope of the invention.

What is claimed:

1. A computerized method of fabricating an electromagnetic band gap (EBG) element comprising:
   a. providing an ink jet printing system comprising:
      i. a first print head, sized and configured to dispense a dielectric ink composition;
      ii. a second print head sized and configured to dispense a conductive ink composition;
      iii. a conveyor, operably coupled to the first, and the second print heads configured to convey a substrate to each of the first, and the second print heads; and
      iv. a computer aided manufacturing ("CAM") having a central processing module (CPM), in communication with conveyor, and each of the first, and second print heads, the CPM further comprising: at least one processor in communication with a non-transitory computer readable storage medium storing thereon instructions that, when executed by the at least one processor cause the CPM to control the ink-jet printing system, by carrying out steps that comprise: receiving a 3D visualization file representing the EBG element; and generating a file library having a plurality of files, each file representing a substantially 2D layer for printing the EBG element, and a metafile representing at least the printing order of each of the substantially 2D layers for printing;
   b. receiving the 3D visualization file representing the EBG element;
   c. generating the library of files representing the substantially 2D layer for printing;
   d. providing the dielectric ink composition, and the conductive ink composition;
   e. obtaining from the library a first file representing a first printing layer of the EBG element, the first file comprising printing instructions for a pattern representative of at least one of: the dielectric ink, and the conductive ink;
   f. using the first print head, forming a pattern representative of the dielectric ink in the first printing layer;
   g. curing the pattern corresponding to the dielectric ink in the first layer;
   h. using the second print head, forming a pattern representative of the conductive ink in the first printing layer;
   i. sintering the pattern corresponding to the conductive ink in the first layer;
   j. obtaining from the library a subsequent file representative of a subsequent layer for printing the EBG element; the subsequent file comprising printing instructions for a pattern representative of at least one of: the dielectric ink, and the conductive ink in the subsequent layer;
   k. repeating the steps of: using the first print head, forming the pattern representative of the dielectric ink in the subsequent layer, to the step of sintering the pattern representative of the conductive ink in the subsequent layer, wherein upon curing and/or sintering a final layer, the EBG element comprises:
      i. an electrically conducting ground plane having an apical surface and a basal surface
      ii. a dielectric medium having a basal surface and an apical surface disposed over the electrically conducting ground plane;
      iii. a plurality of polygonal conducting elements each having an apical surface and a basal surface disposed adjacently to, and distanced from each other on the apical surface of the dielectric medium, each polygonal conducting element further comprises at least two opposing facet walls extending basally, wherein each conducting element is coupled to the electrically conducting ground plane by a blind via; and
      iv. a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore; and
   l. removing the substrate.

2. The method of claim 1, wherein upon curing and/or sintering the final layer each facet wall extends basally to a predetermined depth U within the dielectric medium.

3. The method of claim 2, wherein upon curing and/or sintering the final layer each polygonal conducting element is distanced from an adjacent conducting element by a predetermined distance $t_1$.

4. The method of claim 3, wherein upon curing and/or sintering the final layer each polygonal gapping structure extends apically from the apical face of the electrically conducting ground plane to a predetermined gap g1 between the apical surface of the polygonal gapping structure and the basal surface of the associated polygonal conducting element.

5. The method of claim 4, wherein upon curing and/or sintering the final layer $g_1$ is operable to define a predetermined lower frequency limit to be blocked by the EBG element.

6. The method of claim 4, wherein upon curing and/or sintering the final layer U and $t_1$ are together operable to define a predetermined upper frequency limit to be blocked by the EBG element.

7. The method of claim 1, wherein upon curing and/or sintering the final layer:
   a. at least one facet wall of each polygonal conducting element further comprises pair of laterally extending and vertically overlapping identical slabs, disposed at a predetermined vertical distance from each other, wherein the pair of slabs, embedded within the dielectric medium are extending laterally to cover a portion of the distance to the adjacent polygonal conducting element; and
   b. a complementary slab extending laterally from a facet wall diametrically opposing the facet wall with the pair of laterally extending identical slabs,
   wherein adjacent polygonal conducting elements are arranged such that the complementary slab is interdisposed between, and overlaps with the pair of laterally extending and vertically overlapping identical slabs at a predetermined gap g2, between the upper surface of the complementary slab and the lower surface of the upper slab of the pair of laterally extending and vertically overlapping identical slabs.

8. The method of claim 7 wherein upon curing and/or sintering the final layer, $g_2$ is operable to define a predetermined upper frequency limit to be blocked by the EBG element.

9. The method of claim 7, wherein upon curing and/or sintering the final layer, the complementary slab overlaps with the pair of laterally extending and vertically overlapping identical slabs over between about 60% and about 99% of the surface area of the pair of laterally extending and vertically overlapping identical slabs.

10. The method of claim 1, wherein upon curing and/or sintering the final layer the gapping polygonal structures has the same number of facets as the polygonal conducting elements.

11. The method of claim 1, wherein the step of: using the CPM, generating a file library having a plurality of files, each file representing a substantially 2D layer for printing the EBG element, further comprises: for each file representing the substantially 2D layer of dielectric ink pattern, generating a sub library of conductive ink pattern files, each conductive ink pattern file in the sub-library representing a substantially 2D layer for printing, and a metafile with at least one of: an order of printing, an identifier of the file of substantially 2D layer of dielectric ink pattern file the sub-library conductive file is associated with, and instructions on the speed of printing.

12. An electromagnetic band gap (EBG) element comprising:
   a. an electrically conducting ground plane having an apical surface and a basal surface
   b. a dielectric medium having a basal surface and an apical surface disposed over the electrically conducting ground plane;
   c. a plurality of polygonal conducting elements each having an apical surface and a basal surface disposed adjacently to, and distanced from each other on the apical surface of the dielectric medium, each polygonal conducting element further comprises at least two opposing facet walls extending basally, wherein each conducting element is coupled to the electrically conducting ground plane by a blind via; and
   d. a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore.

13. The EBG element of claim 12, wherein each facet wall extends basally to a predetermined depth U within the dielectric medium.

14. The EBG element of claim 13, wherein each polygonal conducting element is distanced from an adjacent conducting element by a predetermined distance $t_1$.

15. The EBG element of claim 14, wherein each polygonal gapping structure extends apically from the apical face of the electrically conducting ground plane to a predetermined gap g1 between the apical surface of the polygonal gapping structure and the basal surface of the associated polygonal conducting element.

16. The EBG element of claim 15, wherein $g_1$ is operable to define a predetermined lower frequency limit to be blocked by the EBG element.

17. The EBG element of claim 15, wherein L and t are together operable to define a predetermined upper frequency limit to be blocked by the EBG element.

18. The EBG element of claim 12, wherein:
   a. at least one facet wall of each polygonal conducting element further comprises pair of laterally extending and vertically overlapping identical slabs, disposed at a predetermined vertical distance from each other, wherein the pair of slabs, embedded within the dielectric medium are extending laterally to cover a portion of the distance to the adjacent polygonal conducting element; and
   b. a complementary slab extending laterally from a facet wall diametrically opposing the facet wall with the pair of laterally extending identical slabs,
   wherein adjacent polygonal conducting elements are arranged such that the complementary slab is interdisposed between, and overlaps with the pair of laterally extending and vertically overlapping identical slabs at a predetermined gap g2, between the upper surface of the complementary slab and the lower surface of the upper slab of the pair of laterally extending and vertically overlapping identical slabs.

19. The EBG element of claim 18 wherein g2 is operable to define a predetermined upper frequency limit to be blocked by the EBG element.

20. The EBG element of claim 18, wherein the complementary slab overlaps with the pair of laterally extending and vertically overlapping identical slabs over between about 60% and about 99% of the surface area of the pair of laterally extending and vertically overlapping identical slabs.

21. The EBG element of claim 12, wherein the gapping polygonal structures has the same number of facets as the polygonal conducting elements.

22. An article of manufacture comprising a non-transitory memory storage device storing thereon a computer readable medium (CRM) for fabricating an electromagnetic band gap (EBG) element, the CRM comprising a set of executable instructions configured to, when executed by at least one processor, cause the at least one processor to perform the steps of:
   a. receiving the 3D visualization file representing the EBG element;
   b. generating a file library having a plurality of files, each file representing a substantially 2D layer for printing the EBG element, and a metafile representing at least the printing order of each of the substantially 2D layers for printing;
   c. obtaining from the library a first file representing a first printing layer of the EBG element, the first file comprising printing instructions for a pattern representative of at least one of: the dielectric ink, and the conductive ink;
   d. using a first print head, in communication with the at least one processor, operable to dispense dielectric ink, included with the article of manufacture in communication with the at least one processor, forming a pattern representative of the dielectric ink in the first printing layer of the EBG;
   e. using an electromagnetic radiation source in communication with the at least one processor, curing the pattern corresponding to the dielectric ink in the first layer;
   f. using a second print head operable to dispense conductive ink, in communication with the at least one processor, forming a pattern representative of the conductive ink in the first printing layer of the EBG;
g. using a focused heat source in communication with the at least one processor, sintering the pattern corresponding to the conductive ink in the first layer;
h. obtaining from the library a subsequent file representative of a subsequent layer for printing the EBG element; the subsequent file comprising printing instructions for a pattern representative of at least one of: the dielectric ink, and the conductive ink in the subsequent layer;
i. repeating the steps of: forming the pattern corresponding to the dielectric ink in the subsequent layer, to the step of sintering the pattern corresponding to the conductive ink in the subsequent layer, wherein upon curing and/or sintering a final layer, the EBG element is configured to comprise:
  i. an electrically conducting ground plane having an apical surface and a basal surface
  ii. a dielectric medium having a basal surface and an apical surface disposed over the electrically conducting ground plane;
  iii. a plurality of polygonal conducting elements each having an apical surface and a basal surface disposed adjacently to, and distanced from each other on the apical surface of the dielectric medium, each polygonal conducting element further comprises at least two opposing facet walls extending basally, wherein each conducting element is coupled to the electrically conducting ground plane by a blind via; and
  iv. a plurality of gapping polygonal structures each associated with a polygonal conducting element and having an apical surface, the gapping polygonal structure extending apically from the apical surface of the electrically conducting ground plane, wherein each gapping polygonal structures defining a concentric bore wherein the blind via is disposed coaxial with the bore.

23. The article of manufacture of claim 22, wherein: in generating the file library having a plurality of files, each file representing a substantially 2D layer for printing the EBG element, the set of executable instructions is further configured to, when executed by the at least one processor, cause the at least one processor to: for each file representing the substantially 2D layer of dielectric ink pattern, generate a sub library of conductive ink pattern files, each file of conductive ink pattern in the sub-library representing a substantially 2D layer for printing, and a metafile with at least one of: an order of printing, an identifier of the file of substantially 2D layer of dielectric ink pattern file the sub-library conductive file is associated with, and instructions on the speed of printing.

* * * * *